(12) United States Patent
Chi

(10) Patent No.: US 10,673,444 B2
(45) Date of Patent: Jun. 2, 2020

(54) MOVING OBJECT DETECTION CIRCUIT AND METHOD THEREOF

(71) Applicant: RichWave Technology Corp., Taipei (TW)

(72) Inventor: Hsiang-Feng Chi, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/395,183

(22) Filed: Apr. 25, 2019

(65) Prior Publication Data

US 2019/0379386 A1    Dec. 12, 2019

(30) Foreign Application Priority Data

Jun. 7, 2018  (TW) .............................. 107119609 A

(51) Int. Cl.
| | |
|---|---|
| *H03L 7/185* | (2006.01) |
| *G01S 7/40* | (2006.01) |
| *G01S 13/93* | (2020.01) |
| *H03L 7/085* | (2006.01) |

(52) U.S. Cl.
CPC ............ *H03L 7/185* (2013.01); *G01S 7/4004* (2013.01); *G01S 13/93* (2013.01); *H03L 7/085* (2013.01)

(58) Field of Classification Search
CPC ..................................................... H03L 7/185
USPC ............................................................. 331/16
See application file for complete search history.

(56) References Cited

U.S. PATENT DOCUMENTS

| 9,831,881 B2 | 11/2017 | Josefsberg | |
|---|---|---|---|
| 2009/0262006 A1* | 10/2009 | McNeill | ..................... G01S 7/35 342/22 |
| 2017/0160391 A1* | 6/2017 | Satou | ...................... G01S 13/42 |

FOREIGN PATENT DOCUMENTS

| CN | 102798436 A | 11/2012 |
|---|---|---|
| CN | 105229431 A | 1/2016 |
| EP | 3 084 464 B1 | 1/2018 |
| TW | 201539009 A | 10/2015 |

* cited by examiner

*Primary Examiner* — Joseph Chang
(74) *Attorney, Agent, or Firm* — Winston Hsu

(57) ABSTRACT

A moving object detection circuit for detecting movement information of a measured object. The moving object detection circuit includes a mixing circuit, an analog-to-digital conversion circuit, a mixing unit, and a distance detecting unit. The mixing circuit mixed the RF carrier signal and a first analog signal to generate a second analog signal. The first analog signal is generated by a signal reflected from the measured object. The analog-to-digital conversion circuit coupled to the mixing circuit for generating a digital signal according to the second analog signal. The mixing unit mixed an IF signal and a first/second IF carrier signal to generate a first/second signal. The distance detecting unit generated a detection result according to the first signal and the second signal. The detection result is corresponding to a distance between the measured object and the moving object detection circuit.

20 Claims, 11 Drawing Sheets

MOVING OBJECT DETECTION CIRCUIT AND METHOD THEREOF

TECHNICAL FIELD

The present invention is relates to a moving object detection circuit, and more particularly to a moving object detection circuit using a double sideband intermediate frequency carrier radar to detect the moving distance of an object.

BACKGROUND

Using a transceiver to emit microwave and to detect the signal reflected by a measured object is a commonly used detection method. In the object detection technology of the prior art, the I/Q signal can be directly converted to extract phase information. However, in the signal processing, DC offset, flicker noise, and leakage from the transmitter to the receiver cannot be easily reduced. For this reason, solutions are still needed to improve the shortcomings of the prior art.

SUMMARY

An embodiment provides a moving object detection circuit for detecting movement information of a measured object. The moving object detection circuit comprises a first mixing circuit, an analog-to-digital conversion circuit, a first mixing unit, and a distance detecting unit. The first mixing circuit is configured to mix the radio frequency (RF) carrier signal and the first analog signal to generate a second analog signal. The first analog signal is generated by a signal reflected from the measured object. The analog-to-digital conversion circuit is coupled to the first mixing circuit for generating at least one digital signal according to the second analog signal. The first mixing unit is configured to mix the intermediate frequency (IF) signals according to the first IF carrier signal and the second IF carrier signal respectively to generate the first signal and the second signal. The first IF carrier signal and the second IF carrier signal are related to the intermediate frequency, and the IF signal is related to the at least one digital signal. The distance detecting unit is configured to generate a detection result according to the first signal and the second signal. The detection result corresponds to a distance between the measured object and the moving object detection circuit. The distance detecting unit comprises a time domain to frequency domain analysis unit and a spectral peak analysis unit. The time domain to frequency domain analysis unit is configured to generate at least one frequency domain signal according to the first signal and the second signal. The spectral peak analysis unit is configured to perform spectral peak selection according to the at least one frequency domain signal to generate a calculated value related to the detection result.

Another embodiment provides a method for detecting movement information of a measured object. The method includes mixing the IF signals according to the first IF carrier signal and the second IF carrier signal respectively to generate the first signal and the second signal, generating at least one frequency domain signal according to the first signal and the second signal; performing spectral peak selection according to the at least one frequency domain signal to generate a calculated value, and obtaining a detection result according to the calculated value. The IF signal is related to at least one digital signal generated according to the signal reflected by the measured object, and the detection result corresponds to the distance of the measured object.

DETAILED DESCRIPTION

Figure 1:
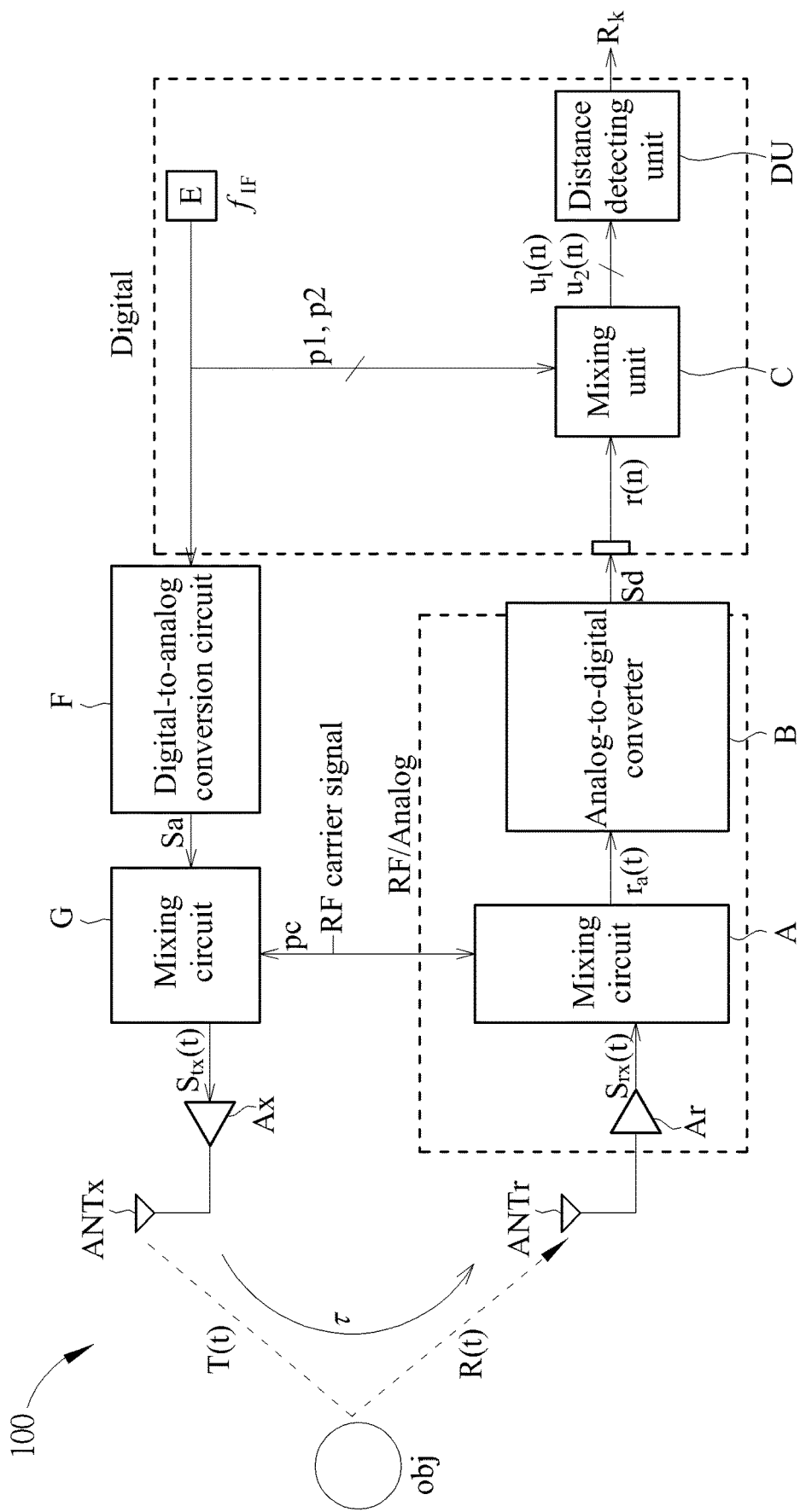
FIG. 1 is a diagram of a moving object detection circuit of an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a diagram of a moving object detection circuit 100 of an embodiment. The moving object detection circuit 100 can detect the movement information of the measured object obj. The moving object detection circuit 100 includes a mixing circuit A, an analog-to-digital conversion circuit B, a mixing unit C, and a distance detecting unit DU. The mixing circuit A can mix a RF carrier signal pc and a received analog signal $S_{rx}(t)$ to generate an analog signal $r_a(t)$. The analog received signal $S_{rx}(t)$ can be generated according to a received radio frequency (RF) signal R(t). The received RF signal R(t) is generated by a transmitted RF signal T(t) reflected by the measured object obj. The analog-to-digital conversion circuit B is coupled to the mixing circuit A for generating at least one digital signal Sd according to the analog signal $r_a(t)$. The mixing unit C, such as a digital mixing unit, is configured to mix an IF signal r(n) and the first IF carrier signal and the second IF carrier signal p2 to generate a first signal $u_1(n)$ and a second signal $u_2(n)$, respectively. The first signal $u_1(n)$ and a second signal $u_2(n)$ could be baseband signals. The IF carrier signal p1 and the second IF carrier signal p2 are related to the intermediate frequency $f_{IF}$. The IF signal r(n), such as a digital IF signal, is related to the at least one digital signal Sd. The distance detecting unit DU generates a detection result $R_k$ according to the first signal $u_1(n)$ and the second signal $u_2(n)$. The detection result $R_k$ corresponds to the distance between the measured object obj and the moving object detecting circuit 100. The notation t in FIG. 1 is the radio wave roundtrip delay. The first IF carrier signal p1 and the second IF carrier signal p2 are generated according to the intermediate frequency $f_{IF}$. The movement information of the measured object obj is the distance between the measure object obj and the moving object detection circuit 100 while the measured object obj is in motion. In this embodiment, the digital portion of the moving object detection circuit 100, such as the mixing unit C and the distance detecting unit DU, is implemented in form of a digital circuit. In one other embodiment, the digital portion of the moving object detection circuit 100 may also be one or several software modules in a non-volatile memory (e.g., a firmware) to be implemented by a digital signal processor. In yet another embodiment, the digital portion of the moving object detection circuit 100 may also be implemented in form of partially digital circuits and partially software modules implemented by the digital signal processor. In yet another embodiment, the moving object detection circuit 100 further includes a reference signal generating unit E, an digital-to-analog conversion circuit F and a mixer circuit G. The reference signal generating unit E can be a digital direct frequency synthesizer, for generating the first IF carrier signal p1 and the second IF carrier signal p2. After the received RF signal R(t) is received by the receiving circuit comprised of an amplifier Ar and an antenna device ANTr, an received analog signal $S_{rx}(t)$ is generated. A transmitted analog signal $S_{tx}(t)$ is transmitted by a transmit circuit comprised of an amplifier Ax and an antenna device ANTx to generate the transmitted RF signal T(t). The mixing circuit G can receive the analog signal Sa and the RF carrier signal pc to generate the transmitted analog signal $S_{tx}(t)$. The digital-to-analog conversion circuit F is configured to generate the analog signal Sa according to the first IF carrier signal p1 or the second IF carrier signal p2.

Figure 2:
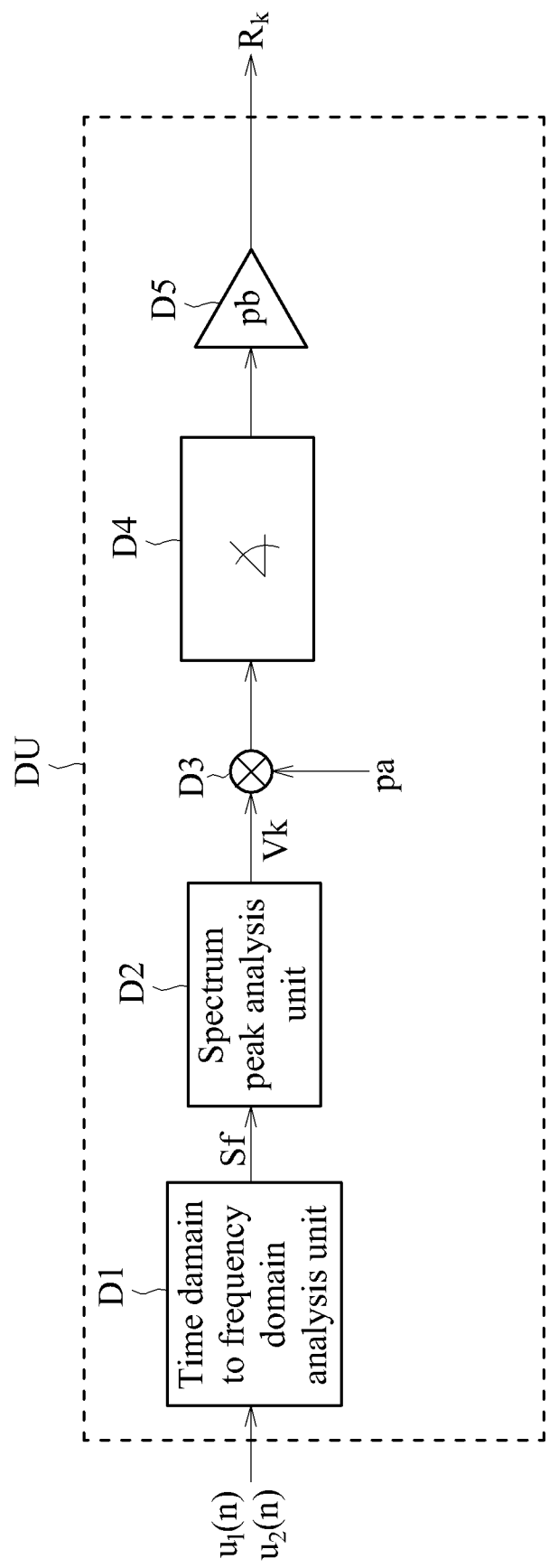
FIG. 2 is a diagram of the distance detecting unit of FIG. 1.

FIG. 2 is a diagram of the distance detecting unit DU of FIG. 1. The distance detecting unit DU may include a time domain to frequency domain analysis unit D1 and a spectral peak analysis unit D2. The time domain to frequency domain analysis unit D1 is configured to generate at least one frequency domain signal Sf according to the first signal $u_1(n)$ and the second signal $u_2(n)$. The spectral peak analysis unit D2 may perform spectral peak selection according to the frequency domain signal Sf to generate a calculated value Vk, wherein the calculated value Vk is related to the detection result $R_k$. According to the embodiment, the distance detecting unit DU can further include a multiplication unit D3, a phase extraction unit D4, and an amplification unit D5. The multiplication unit D3 can multiply the calculated value Vk and an adjustment parameter pa to get a product of the calculated value Vk and the adjustment parameter pa. The phase extraction unit D4 can extract the phase value of the product of the calculated value Vk and the adjustment parameter pa. The phase value corresponds to a complex argument, which can be expressed as ∡ or Arg( ). The amplification unit D5 can multiply the phase value by the adjustment parameter pb to generate the detection result $R_k$.

Figure 3:
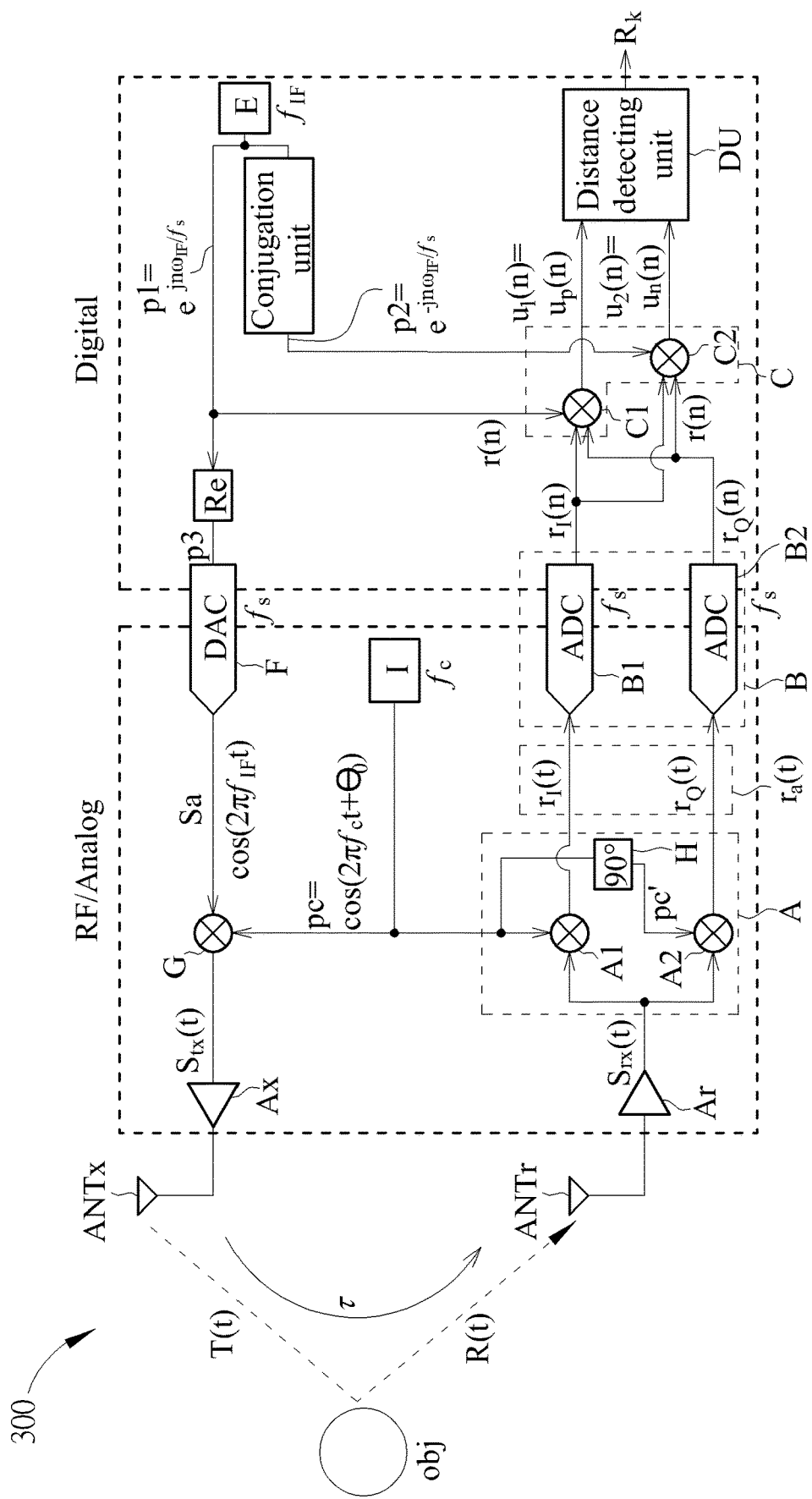
FIG. 3 is a diagram of a moving object detection circuit of an embodiment.

FIG. 3 is a diagram of a moving object detection circuit 300 of an embodiment. The moving object detection circuit 300 can be one of the implementations of the moving object detection circuit 100. The embodiment in FIG. 3 can be an intermediate frequency (IF) carrier Doppler radar with a single channel analog-to-digital converter (ADC) and a digital IF down converter. The moving object detection circuit 300 can be a digital intermediate frequency double sideband carrier radar with I/Q digitization functions. In FIG. 3, the mixing circuit A can comprise a mixer A1 and a mixer A2. The mixer A1 can mix the RF carrier signal pc and the received analog signal $S_{rx}(t)$ to generate an in-phase (I) analog signal $r_I(t)$. The mixer A2 can mix the phase shift signal pc' and the received analog signal $S_{rx}(t)$ to generate a quadrature (Q) analog signal $r_Q(t)$. The analog signal $r_a(t)$ described in FIG. 1 may include an I analog signal $r_I(t)$ and a Q analog signal $r_Q(t)$ in the embodiment of FIG. 3, and the phase shift signal pc' may be generated from the RF carrier signal pc by shifting one phase shift value (for example, 90°). According to an embodiment, the RF carrier signal pc may be expressed as $\cos(2\pi f_c t+\theta_0)$, where $f_c$ is the carrier frequency, and $\theta_0$ is the initial phase value. The analog-to-digital conversion circuit B may include an analog-to-digital converter B1 and an analog-to-digital converter B2. The analog-to-digital converter B1 can receive the I analog signal $r_I(t)$ to generate the I digital signal $r_I(n)$. The analog-to-digital converter B2 can receive the Q analog signal $r_Q(t)$ to generate the Q digital signal $r_Q(n)$. In this example, the digital signal Sd of FIG. 1 may include the I digital signal $r_I(n)$ and a Q digital signal $r_Q(n)$. The digital-to-analog conversion circuit F may include an digital-to-analog converter. The notation ADC in this figure represents an analog-to-digital converter, and DAC represents a digital-to-analog converter. According to the embodiment, the mixers A1 and A2 may have a function of a band pass filtering to remove RF images of the high frequency portion.

As shown in FIG. 3, the mixing unit C may include complex multiplication units C1 and C2. The IF signal r(n) is, for example, a complex digital signal r(n) including an I digital signal $r_I(n)$ and a Q digital signal $r_Q(n)$. In this embodiment, the first IF carrier signal p1 and the second IF carrier signal p2 are a first intermediate frequency complex sinusoidal signal p1 and a second intermediate frequency complex sinusoidal signal p2 respectively. The second intermediate frequency complex sinusoidal signal p2 is a conjugate of the first intermediate frequency complex sinusoidal signal p1. The complex multiplication unit C1 can perform a complex multiplication of the first intermediate frequency complex sinusoidal signal p1 with the IF signal r(n) to generate the first signal $u_1(n)$. The complex multiplication unit C2 can perform a complex multiplication of the second intermediate frequency complex sinusoidal signal p2 with the IF signal r(n) to generate a second signal $u_2(n)$. The first intermediate frequency complex sinusoidal signal p1 is an intermediate frequency carrier with a positive frequency, which can be expressed as $\exp(jn\omega_{IF}/f_s)$. The second intermediate frequency complex sinusoidal signal p2 is an intermediate frequency carrier with a negative frequency, which can be expressed as $\exp(-jn\omega_{IF}/f_s)$. The notation j represents an imaginary unit and $\omega_{IF}$ corresponds to the angular frequency of the frequency $f_{IF}$ of the intermediate frequency signal. The notation $f_s$ is a sampling rate of the analog to digital conversion performed by the system and the notation n is the parameter of the digital signal. In this embodiment, the first signal $u_1(n)$ may be a complex signal $u_p(n)$ which is mixed signal of the complex digital signal r(n) and an IF carrier signal p1, and the second signal $u_2(n)$ may be a complex signal $u_n(n)$ which is a mixed signal of the digital signal r(n) and the IF carrier signal p2.

As shown in FIG. 3, the moving object detection circuit 300 further includes a reference signal generating unit E, a digital-to-analog conversion circuit F, a mixing circuit G, a phase shift circuit H, and a reference signal generating circuit I. The reference signal generating unit E can be a digital direct frequency synthesizer for generating the first intermediate frequency complex sinusoidal signal p1, the second intermediate frequency complex sinusoidal signal p2, and a third IF carrier signal p3 related to the intermediate frequency $f_{IF}$. The third IF carrier signal p3 corresponds to the real number part of the first intermediate frequency complex sinusoidal signal p1 or the second intermediate frequency complex sinusoidal signal p2. For example, it can be a third intermediate frequency sinusoidal signal p3. In FIG. 3, a real number unit Re is coupled to the reference signal generating unit E for outputting the third intermediate frequency sinusoidal signal p3. The digital-to-analog conversion circuit F can receive the third intermediate frequency sinusoidal signal p3 to generate an analog signal Sa accordingly. According to the embodiment, the analog signal Sa can be expressed as $\cos(2\pi f_{IF} t)$. The mixing circuit G can receive the analog signal Sa and the RF carrier signal pc to generate an analog transmission signal $S_{rx}(t)$. The phase shift circuit H can receive the RF carrier signal pc to generate the aforementioned phase shift signal pc'. The reference signal generating circuit I can generate the RF carrier signal pc. An amplifier Ax can be disposed at the transmitting terminal, and the antenna device ANTx is disposed at the transmitting terminal. The amplifier Ar is disposed at the receiving terminal, and the antenna device ANTr is disposed at the receiving terminal. The amplifier Ax and the antenna device ANTx form a transmitting circuit, and the amplifier Ar and the antenna device ANTr form a receiving circuit. Amplifiers Ax and Ar and antenna devices ANTx and ANTr can be set to appropriate specifications according to the requirements. In FIG. 3, the moving object detecting circuit 300 can be divided into an RF/analog portion and a digital portion by the digital-to-analog conversion circuit F and the analog-to-digital conversion circuit B. The first intermediate frequency complex sinusoidal signal p1, the second intermediate frequency complex sinusoidal signal p2 and the third intermediate frequency sinusoidal signal p3, related to the intermediate frequency $f_{IF}$, are generated by the digital direct synthesizer to be inputted to the mixing unit C of the complex multiplication units C1 and C2, and the mixing circuit G. It can reduce the influence of DC offset and the flicker noise on the moving object detection circuit 300.

According to FIG. 3, the transmitted analog signal $S_{rx}(t)$ may be expressed as $$S_{rx}(t) = A_0 \cdot \cos(\omega_c t + \theta_0) \cdot \cos(\omega_{IF} t)$$

where $\omega_c = 2\pi f_c$, $\omega_{IF} = 2\pi f_{IF}$, $A_0$ is corresponding to the amplitude of $s_{rx}(t)$.

The received signals for uniform scatters may be expressed as follows. The radio round trip delays of K moving scatters can be expressed as $$\tilde{\tau}_k^{motion}(t) = 2\tilde{R}_k^{motion}(t)/c, k < K.$$

And the radio round trip delay of L fixed scatters can be expressed as $$\tau_l^{still} = 2R_l^{still}/c, 0 \le l < L.$$

$\tilde{R}(t)$ can be the distance between the antenna device ANTx and ANTr to the measured object and c is the velocity of EM wave transmission.

The received analog signal $S_{rx}(t)$ can be expressed as $$S_{rx}(t) =$$

$$\sum_{k=0}^{K-1} \frac{A_k^{motion}}{2\tilde{R}_k^{motion}(t)} \cos\left(\omega_c\left(t - \tilde{\tau}_k^{motion}(t) - D_a\right) + \theta_0\right) \cos\left(\omega_{IF}\left(t - \tilde{\tau}_k^{motion}(t) - D_a\right)\right) +$$

(corresponding to moving objects)

$$\sum_{l=0}^{L-1} \frac{A_l^{still}}{2R_l^{still}} \cos(\omega_c(t - \tau_l^{still} - D_a) + \theta_0) \cdot \cos(\omega_{IF}(t - \tau_l^{still} - D_a)) +$$

(corresponding to static objects)

$$\frac{B}{2} \cdot \cos(\omega_c(t - D_a) + \theta_0) \cdot \cos(\omega_{IF}(t - D_a))$$

(corresponding to leakage)

In the above equation, the first term corresponds to the moving object, the second term corresponds to the static object, and the third term corresponds to the leakage portion.

1e;.5q$A_k^{motion}$ corresponds to the moving object directly proportional to the parameter of the radar cross section. $A_l^{still}$ corresponds fixed object directly proportional to the to the parameter of the radar cross section. B corresponds to the leakage value, which is related to the isolation of antennas. $D_a$ is aggregate processing delay, and may include the delay of the digital direct synthesizer to the antenna device ANTx in the digital portion of FIG. 3, and the delay of the antenna device ANTr to the complex multiplication units C1 and C2. Due to the amplitude modulation and/or phase modulation effect of the amplifier Ax, Da is related to the input power of the amplifier Ax at the transmitting terminal. The third term can be generated by the leakage of the RF/analog portion of the circuit, antennas, or the printed circuit board from the transmitting terminal to the receiving terminal.

The RF carrier signal pc and the phase shift signal pc' may be combined to represent a complex form of the signal $\exp(j(\omega_c t + \theta_0))$. By mixing the signal $S_{rx}(t)$ and $\exp(j(\omega_c t + \theta_0))$ through the mixing circuit A and removing the high frequency portion, the following equation can be obtained.

$$r_a(t) = r_I(t) + jr_Q(t) =$$

$$\sum_{k=0}^{K-1} \frac{A_k^{motion}}{\tilde{R}_k^{motion}(t)} \cdot \exp(j\omega_c(\tilde{\tau}_k^{motion}(t) + D_a)) \cdot \cos(\omega_{IF}(t - \tilde{\tau}_k^{motion}(t) - D_a)) +$$

$$\sum_{l=0}^{L-1} \frac{A_l^{still}}{R_l^{still}} \exp(j\omega_c(\tau_l^{still} + D_a)) \cdot \cos(\omega_{IF}(t - \tau_l^{still} - D_a)) +$$

$$B \cdot \exp(j\omega_c D_a) \cdot \cos(\omega_{IF}(t - D_a))$$

After the digitizing $r_a(t)$ according to the sampling rate fs through the analog-to-digital conversion circuit B, the digital IF signal r(n) can be obtained.

$$r(n) = r_a(n/f_s) = \sum_{k=0}^{K-1} \frac{A_k^{motion}}{R_k^{motion}(n)} \cdot$$

$$\exp(j\omega_c(\tau_k^{motion}(n) + D)) \cdot \cos(\omega_{IF}(n/f_s - \tau_k^{motion}(n) - D)) +$$

$$\sum_{l=0}^{L-1} \frac{A_l^{still}}{R_l^{still}} \exp(j\omega_c(\tau_l^{still} + D)) \cdot \cos(\omega_{IF}(n/f_s - \tau_l^{still} - D)) +$$

$$B \cdot \exp(j\omega_c D) \cdot \cos(\omega_{IF}(n/f_s - D))$$

where $R_k^{motion}(n) = \tilde{R}(n/f_s)$, $\tau_k^{motion} = \tilde{\tau}(n/f_s)$, and $D = f_s \cdot D_a$.

The complex intermediate frequency I/Q carrier is mixed with the IF signal r(n) by complex multiplication of the complex intermediate frequency sinusoidal signals p1 and p2 through the complex multiplication units C1 and C2, and the base band signal is reserved. Here quadrature mixing is derived in digital domain, in which continuous time signals can be used for simplification. A complex signal can be obtained as follows.

$$u_p(n) = e^{jn\omega_{IF}/f_s} \cdot r(n) = \sum_{k=0}^{K-1} \frac{A_k^{motion}}{R_k^{motion}(n)} \cdot \exp(j(\omega_c + \omega_{IF})(\tau_k^{motion}(n) + D)) +$$

$$\sum_{l=0}^{L-1} \frac{A_l^{still}}{R_l^{still}} \exp(j(\omega_c + \omega_{IF})(\tau_l^{still} + D)) + B \cdot \exp(j(\omega_c + \omega_{IF})D)$$

$$u_p(n) = e^{-jn\omega_{IF}/f_s} \cdot r(n) =$$

$$\sum_{k=0}^{K-1} \frac{A_k^{motion}}{R_k^{motion}(n)} \cdot \exp(j(\omega_c - \omega_{IF})(\tau_k^{motion}(n) + D)) +$$

$$\sum_{l=0}^{L-1} \frac{A_l^{still}}{R_l^{still}} \exp(j(\omega_c + \omega_{IF})(\tau_l^{still} + D)) + B \cdot \exp(j(\omega_c - \omega_{IF})D)$$

In the above equations, B can be a complex number produced by the leakage caused the transmitting and receiving terminals. The propagation delay is expressed as τ(n) =2R(n)/c.

$$u_p(n) = \sum_{k=0}^{K-1} \frac{A_k^{motion}}{R_k^{motion}(n)} \cdot e^{j(\omega_c+\omega_{IF})\left(\frac{2R_k^{motion}(n)}{c}+D\right)} +$$

$$\underbrace{\sum_{l=0}^{L-1} \frac{A_l^{still}}{R_l^{still}} \cdot e^{j(\omega_c+\omega_{IF})\left(\frac{2R_l^{still}}{c}+D\right)} + B \cdot e^{j(\omega_c+\omega_{IF})D}}_{u_{p.DC}}$$

$$u_n(n) = \sum_{k=0}^{K-1} \frac{A_k^{motion}}{R_k^{motion}(n)} \cdot e^{j(\omega_c-\omega_{IF})\left(\frac{2R_k^{motion}(n)}{c}+D\right)} +$$

$$\underbrace{\sum_{l=0}^{L-1} \frac{A_l^{still}}{R_l^{still}} \cdot e^{j(\omega_c-\omega_{IF})\left(\frac{2R_l^{still}}{c}+D\right)} + B \cdot e^{j(\omega_c-\omega_{IF})D}}_{u_{n.DC}}$$

$u_{p.DC}$ is the DC term of $u_p(n)$, $u_{n.DC}$ is the DC term of $u_n(n)$.

Observing N samples in the time period from the starting time $n_0$ can be expressed as $\{n_0+\tilde{n}|0\le\tilde{n}\le N\}$. Assuming the velocity of the moving object being a constant v, the variable distance of the $k_{th}$ moving object can be $R_k^{motion}(n_0)+v_k\cdot\tilde{n}/f_s$, wherein $R_k^{motion}(n_0)$ is the distance corresponding to time $n_0$.

$$u_p(n_0+\tilde{n}) = \sum_{k=0}^{K-1} G_k \cdot e^{j(\omega_c+\omega_{IF})\left(\frac{2R_k^{motion}(n_0)}{c}+D\right)} \cdot e^{j\omega_{D,k}\cdot\tilde{n}} + u_{p.DC},$$

$$0 \le \tilde{n} < N$$

$$u_n(n_0+\tilde{n}) = \sum_{k=0}^{K-1} G_k \cdot e^{j(\omega_c-\omega_{IF})\left(\frac{2R_k^{motion}(n_0)}{c}+D\right)} \cdot e^{j\omega_{D,k}\cdot\tilde{n}} + u_{n.DC},$$

$$0 \le \tilde{n} < N$$

The Doppler frequency can be expressed as $$\omega_{D,k} = \frac{4\pi(f_c + f_{IF})v_k}{f_s \cdot c}.$$

It can be assumed that the amplitude of the signal reflected from the measured object is time-invariant during the above-mentioned time period, and the amplitude is $G_k$, which is directly proportional to $$\frac{A_k^{motion}}{R_k^{motion}}$$

and the radar cross section (RCS).

The result of the discrete time Fourier transform of $\{u_p(n_0+\tilde{n})|0\le\tilde{n}\le N\}$ and $\{u_n(n_0+\tilde{n})|0\le n\le N\}$ is $$U_p(\omega) = \sum_{k=0}^{K-1} G_k \cdot e^{j(\omega_c+\omega_{IF})\left(\frac{2R_k^{motion}(n_0)}{c}+D\right)} \cdot \delta(\omega-\omega_{D,k}) + u_{p.DC}\cdot\delta(\omega)$$

$$U_n(\omega) = \sum_{k=0}^{K-1} G_k \cdot e^{j(\omega_c-\omega_{IF})\left(\frac{2R_k^{motion}(n_0)}{c}+D\right)} \cdot \delta(\omega-\omega_{D,k}) + u_{n.DC}\cdot\delta(\omega)$$

δ is the Dirac delta function. The specific implementation of the discrete time Fourier transform here is a fast Fourier transform (FFT).

Figure 4:
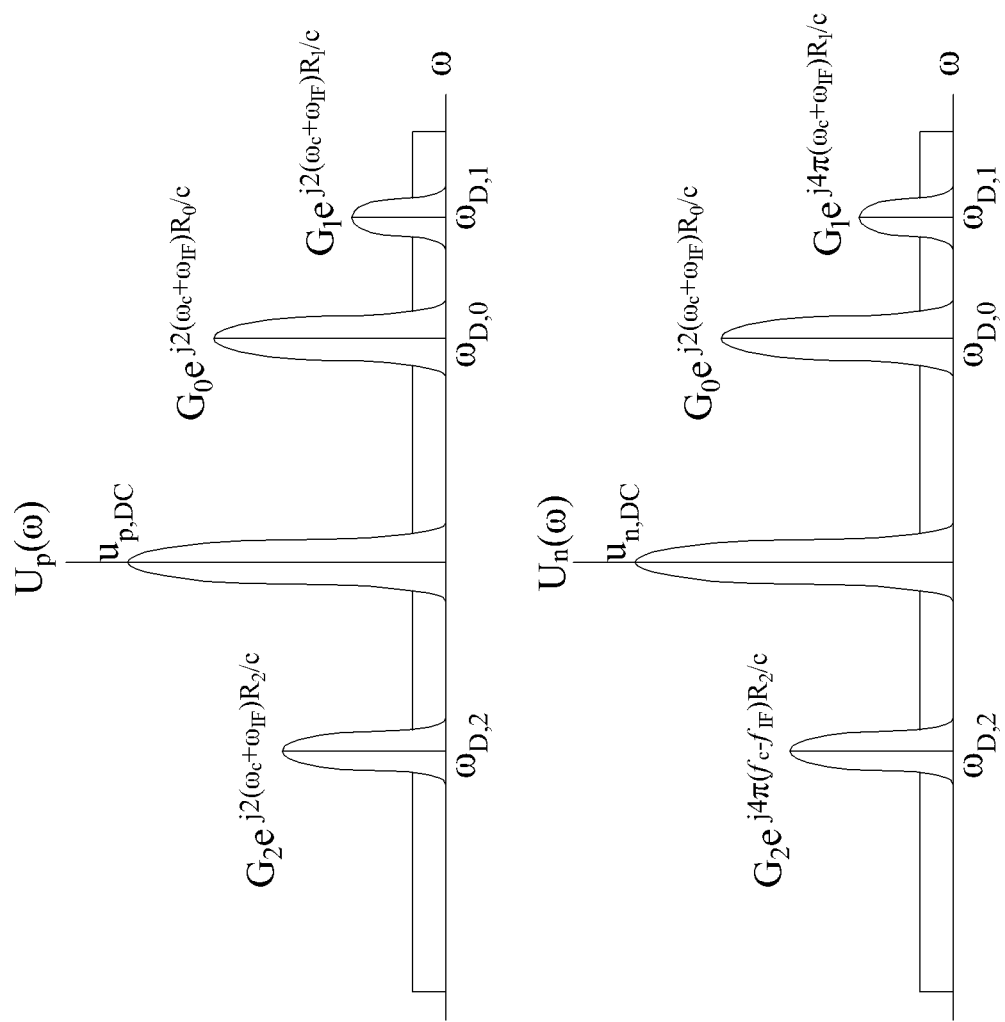
FIG. 4 is the diagram of first frequency domain signal and the second frequency domain signal in the peak region of the spectrum.

FIG. 4 is the diagram of first frequency domain signal $U_p(\omega)$ and the second frequency domain signal $U_n(\omega)$ in the peak region of the spectrum. They are generated respectively by the first signal $u_1(n)$, the positive frequency signal $u_p(n)$, and the second signal $u_2(n)$, negative frequency signal $u_n(n)$, in FIG. 3 through a time domain to frequency domain conversion (such as the Fourier transform). According to the embodiment, the peak region may be selected according to k. The area near the vertical axis (zero frequency) corresponds to a direct current (DC) portion, which corresponds to a static object and a leakage portion.

Figure 5:
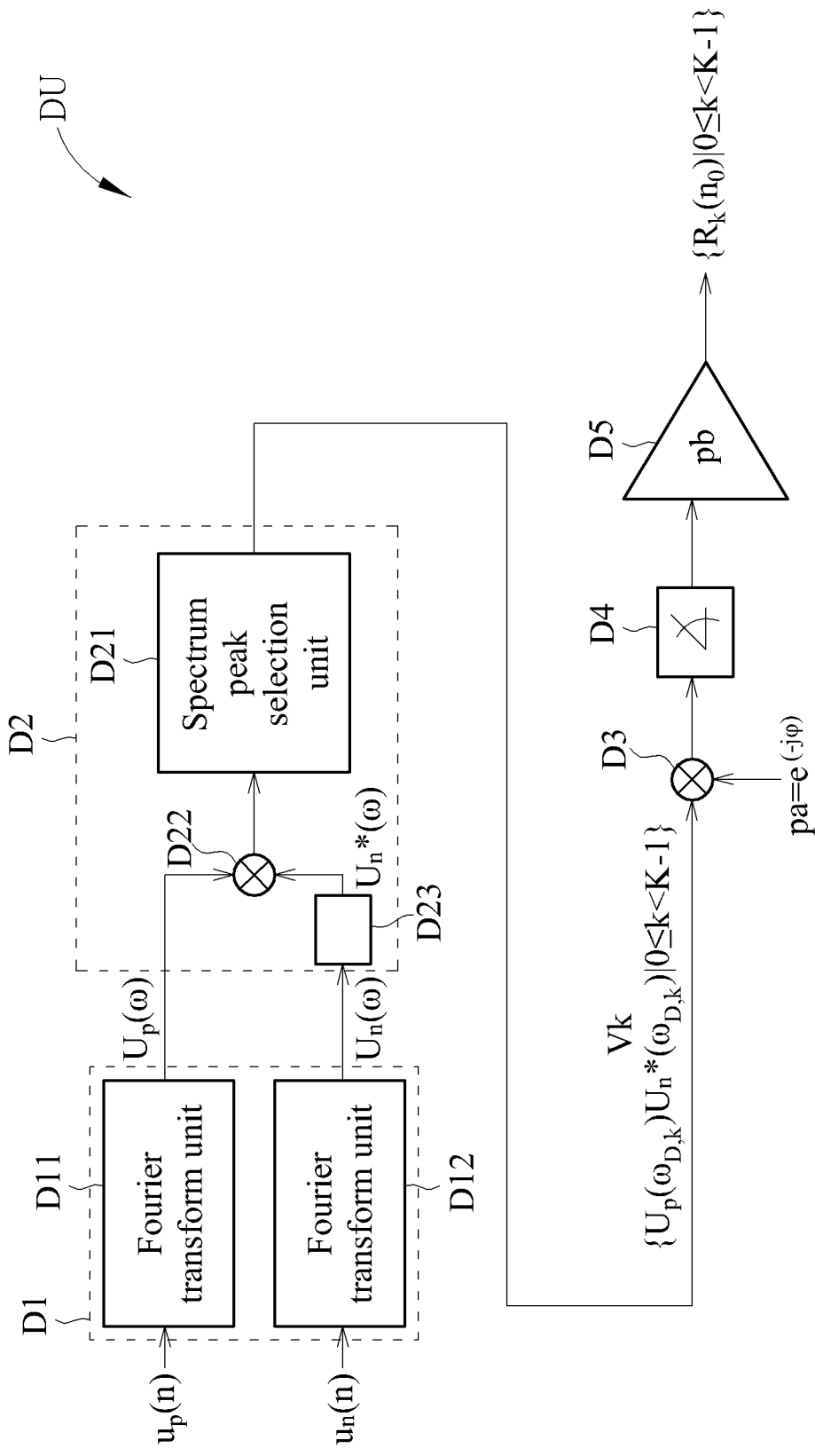
FIG. 5 is a diagram of the distance detecting unit in the embodiment in FIG. 3.

FIG. 5 is a diagram of the distance detecting unit DU in the embodiment in FIG. 3. As shown in FIG. 5, the time domain to frequency domain analysis unit D1 may include Fourier transform units D11 and D12, and the spectral peak analysis unit D2 may include a conjugation unit D23, a multiplication unit D22, and a spectral peak selection unit D21. The Fourier transform unit D11 can perform Fourier transform on the positive frequency signal $u_p(n)$ to generate a first frequency domain signal $U_p(\omega)$. The Fourier transform unit D12 can perform Fourier transform on the negative frequency signal $u_n(n)$ to generate a second frequency domain signal $U_n(\omega)$. The Fourier transform units D11 and D12 can perform short-time Fourier transform (STFT). The frequency domain signal Sf of FIG. 2 may include a first frequency domain signal $U_p(\omega)$ and a second frequency domain signal $U_n(\omega)$. The conjugation unit D23 can perform conjugation on either the first frequency domain signal $U_p(\omega)$ and the second frequency domain signal $U_n(\omega)$ to output a conjugate value signal. In this embodiment, the conjugation unit D23 performs conjugation on the second frequency domain signal $U_n(\omega)$ to output a conjugate value signal $U_n^*(\omega)$. The multiplying unit D22 can multiply the other one of the first frequency domain signal $U_p(\omega)$ or the second frequency domain signal $U_n(\omega)$ that is not conjugated, with the conjugated signal (for example, $U_p(\omega)$ in FIG. 5) to output a frequency domain product. The frequency domain product can be expressed as $U_p(\omega) \cdot U_n^*(\omega)$. The spectral peak selection unit D21 can select a peak region corresponding to the movement information of the measured object obj according to whether the intensity of the frequency domain product has reached a threshold value, to output the calculated value Vk. In the embodiment, Vk may be spectral peaks of the Doppler effect, which may be expressed as $\{U_p(\omega_{D,k})U_n^*(\omega_{D,k})|0 \leq k < K-1\}$. An adjustment parameter pa of the multiplication unit D3 may be $\exp(-j\ \varphi)$, where $\varphi = 2\omega_{IF}D$, $D = f_s D_a$. Da may be aggregate processing delay. An adjustment parameter pb of the amplification unit D5 may be $c/(8\pi f_{IF})$, where c is the velocity of electromagnetic wave, and the detection result $R_k$ may be $\{R_k(n_0)|0 \leq k < K-1\}$. The notation $n_0$ can be the starting time of the observed time period. K and k are positive integers. K represents the total number of K moving objects, and k represents the $k_{th}$ moving object of the K moving objects. According to the embodiment, the spectral peak selection unit D21 of FIG. 5 is disposed before the multiplication unit D22. It means that the spectral peak selection may be performed first, and then multiplication is performed, so that two spectral peak selection units can be implemented.

From the spectrum $U_p(\omega)$ and $U_n(\omega)$, the spectral peaks of the frequency domain product strength can be selected to detect the movement of the measured object. In $U_p(\omega)$ and $U_n(\omega)$, the peak of the spectrum generated by the moving object can occur at the same Doppler frequency. After the peak of the spectrum and the Doppler frequency are confirmed, the distance of the antenna device ANTx and ANTr to the moving object can be estimated as follows.

$$R_k^{motion}(n_0) = c \left( \frac{\angle \{U_p(\omega_{D,k}) \cdot U_n^*(\omega_{D,k}) \cdot e^{-j\varphi}\}}{4\omega_{IF}} \right), 0 \leq k < K$$

where $\varphi = 2\omega_{IF}D$

The calculated distance ranged can include a phase value $\angle \{U_p(\omega_{D,k}) \cdot U_n^*(\omega_{D,k}) \cdot e^{-j\varphi}\}$, where $\angle \{U_p(\omega_{D,k}) \cdot U_n^*(\omega_{D,k}) \cdot e^{-j\varphi}\} < 2\pi$.

In addition, the maximum detectable range $R_{max}$ is limited by phase ambiguity:

$$R_{max} = \frac{c}{4f_{IF}}.$$

Figure 6:
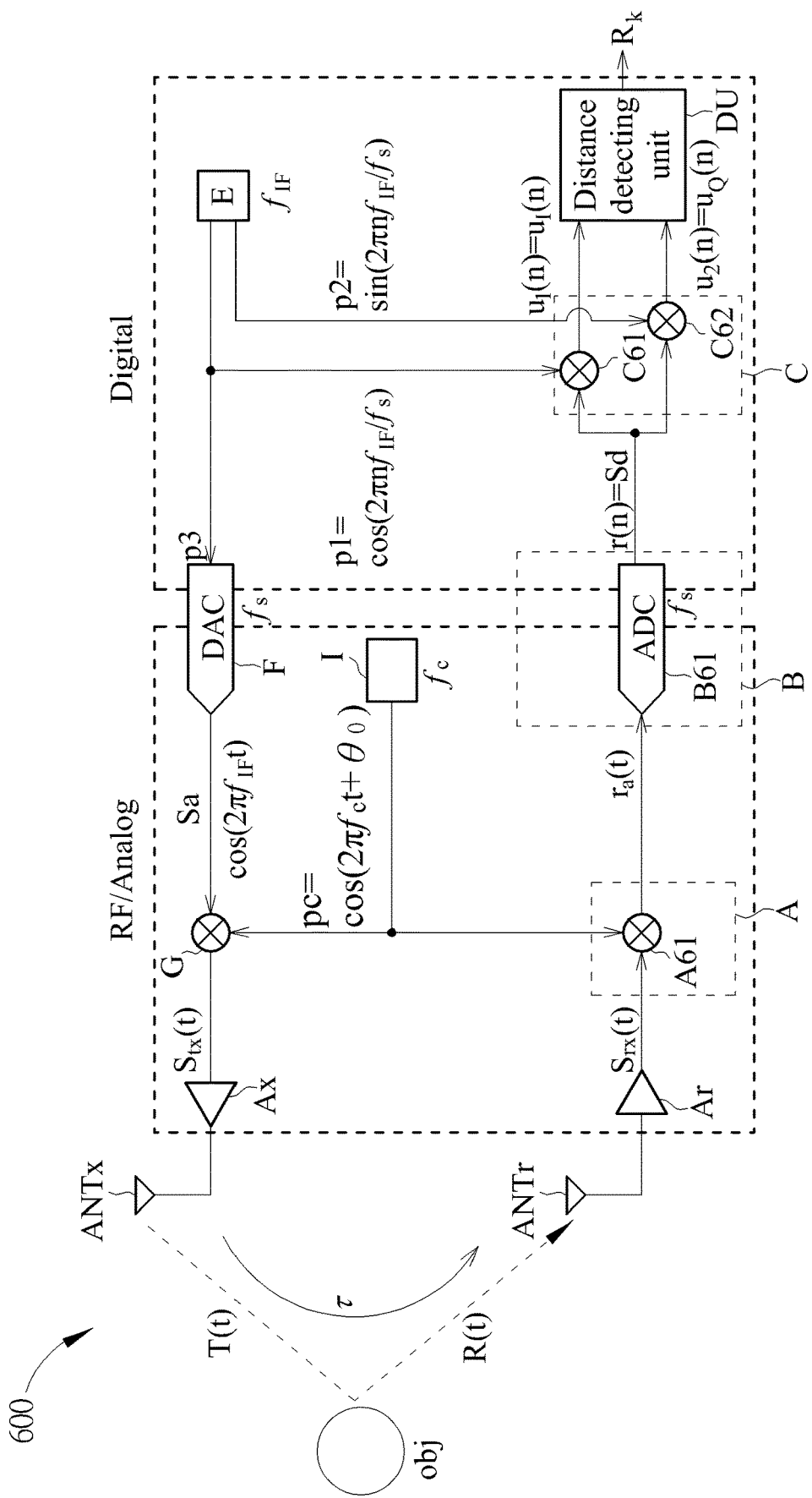
FIG. 6 is a diagram of a moving object detection circuit of an embodiment.

FIG. 6 is a diagram of a moving object detection circuit 600 of an embodiment. The moving object detection circuit 600 can be one of the implementations of the moving object detection circuit 100. The moving object detection circuit 600 can be an intermediate frequency Doppler radar, comprises an analog-to-digital converter and a digital intermediate frequency down converter (IF Doppler radar with single channel ADC and digital IF down converter). In the moving object detection circuit 600, the mixing circuit A may include a single mixer A61, and the analog-to-digital conversion circuit B may include a single analog-to-digital converter B61. The mixing unit C may include multiplication units C61 and C62. The mixer A61 can mix the RF carrier signal pc and the analog signal $S_{tx}(t)$ to generate the analog signal $r_a(t)$. The analog-to-digital converter B61 can generate the digital signal Sd according to the analog signal $r_a(t)$. The digital signal Sd in FIG. 6 can be an IF signal r(n) for inputting into the mixing unit C. The multiplication unit C61 can multiply the first IF carrier signal p1 with the IF signal r(n) to generate the first signal $u_1(n)$, and the multiplication unit C62 can multiply the second IF carrier signal p2 with the IF signal r(n) to generate the second signal $u_2(n)$. In this embodiment, the first IF carrier signal p1 may be the first intermediate frequency sinusoidal signal p1, and the second IF carrier signal p2 may be the second intermediate frequency sinusoidal signal p2. The first signal $u_1(n)$ may be the I signal $u_1(n)$, and the second signal $u_2(n)$ can be the Q signal $u_Q(n)$. The mixer A61 may function as a band pass filter to remove RF images of the high frequency portion.

The moving object detection circuit 600 may include a reference signal generating unit E for generating a first intermediate frequency sinusoidal signal p1, a second intermediate frequency sinusoidal signal p2 and a third intermediate frequency sinusoidal signal p3 all related to the intermediate frequency $f_{IF}$. The first intermediate frequency sinusoidal signal p1 is an intermediate frequency I carrier, which may be expressed as $\cos(2\pi f_{IF}/f_s)$. The second intermediate frequency sinusoidal signal p2 is an intermediate frequency Q carrier which may be expressed as $\sin(2\pi f_{IF}/f_s)$. The third intermediate frequency sinusoidal signal p3 may correspond to or be equal to the first intermediate frequency sinusoidal signal p1. The reference signal generating unit E can be a digital direct synthesizer. According to the embodiment, the moving object detection circuit 600 may further include a digital-to-analog conversion circuit F, a mixing circuit G, and a reference signal generation circuit I. The digital-to-analog conversion circuit F can receive the third intermediate frequency sinusoidal signal p3 to generate an analog signal Sa accordingly, where the analog signal Sa can be expressed as $\cos(2\pi f_{IF}t)$. The mixing circuit G can receive the analog signal Sa and the RF carrier signal pc to generate the analog signal $S_{tx}(t)$ accordingly, where the RF carrier signal pc can be expressed as $\cos(2\pi f_c t + \theta_0)$. The reference signal generating circuit I can generate the RF carrier signal pc. The moving object detection circuit 600 can be divided into RF/analog portion and digital portion by the digital-to-analog conversion circuit F and the analog-to-digital conversion circuit B. The first intermediate frequency sinusoidal signal p1 and the second intermediate frequency sinusoidal signal p2 related to the intermediate frequency $f_{IF}$, are generated by the digital direct synthesizer to be inputted to the mixing unit C respectively. The multiplication units C61 and C62 and the mixing circuit G can reduce the influence of the DC offset and the flicker noise on the moving object detection circuit 600.

For the embodiment in FIG. 6, the analog transmitted signal $S_{tx}(t)$ can be expressed as $$S_{tx}(t) = A_{tx} \cdot \cos(2\pi f_c t + \theta_0) \cdot \cos(2\pi f_{IF} t)$$

$A_{tx}$ corresponds to the amplitude of $S_{tx}(t)$.

The received signals for uniform scatters may be expressed as follows. The radio round trip delays of K moving scatters can be expressed as $$\tilde{\tau}_k^{motion}(t) = 2\tilde{R}_k^{motion}(t)/c, k < K.$$

And the radio round trip delay of L static scatters can be expressed as $$\tau_l^{still} = 2R_l^{still}/c, 0 \leq l < L.$$

$\tilde{R}(t)$ can be the distance between the antenna device ANTx and ANTr to the measured object.

The analog received signal $S_{rx}(t)$ can be expressed as $$S_{rx}(t) = \sum_{k=0}^{K-1} \frac{A_k^{motion}}{2\tilde{R}_k^{motion}(t)} \cos(2\pi f_c(t - \tilde{\tau}_k^{motion}(t) - D) + \theta_0)$$
$$+ \underline{\cos(2\pi f_{IF}(t - \tilde{\tau}_k^{motion}(t) - D))}_{\text{(corresponding to moving object)}}$$

$$+ \sum_{l=0}^{L-1} \frac{A_l^{still}}{2R_l^{still}} \cos(2\pi f_c(t - \tau_l^{still} - D) + \theta_0) \cdot$$
$$\underline{\cos(2\pi f_{IF}(t - \tau_l^{motion} - D))}_{\text{(corresponding to static object)}}$$

$$+ \underline{\frac{B}{2} \cdot \cos(2\pi f_c(t - D) + \theta_0) \cdot \cos(2\pi f_{IF}(t - D))}_{\text{(corresponding to leakage)}}$$

The third term can be generated by the leakage of the RF/analog portion of the circuit or the printed circuit board from the transmitting terminal to the receiving terminal. D is the processing delay, which may include the delay of the digital direct synthesizer to the antenna device ANTx and the delay of the antenna device ANTr to the complex multiplication units C61 and C62.

After mixing the signal $S_{rx}(t)$ with $\cos(2\pi f_c t + \theta_0)$ through the mixing circuit A and removing the high frequency portion, the following equation can be obtained.

$$r_a(t) =$$
$$\sum_{k=0}^{K-1} \frac{A_k^{motion}}{\tilde{R}_k^{motion}(t)} \cdot \cos(2\pi f_c(\tilde{\tau}_k^{motion}(t) + D)) \cdot \cos(2\pi f_{IF}(t - \tilde{\tau}_k^{motion}(t) - D)) +$$
$$\sum_{l=0}^{L-1} \frac{A_l^{still}}{R_l^{still}} \cos(2\pi f_c(\tau_l^{still} + D)) \cdot \cos(2\pi f_{IF}(t - \tau_l^{still} - D)) +$$
$$B \cdot \cos(2\pi f_c D) \cdot \cos(2\pi f_{IF}(t - D))$$

After digitizing $r_a(t)$ according to the sampling rate fs through the analog-to-digital conversion circuit B, the digital IF signal $r(n)$ can be obtained.

$$r(n) = r_a\left(\frac{n}{f_s}\right) = \sum_{k=0}^{K-1} \frac{A_k^{motion}}{R_k^{motion}(n)} \cdot$$
$$\cos(\omega_c(\tau_k^{motion}(n) + D)) \cdot \cos(\omega_{IF}(n/f_s - \tau_k^{motion}(n) - D)) +$$
$$\sum_{l=0}^{L-1} \frac{A_l^{still}}{R_l^{still}} \cos(\omega_c(\tau_l^{still} + D)) \cdot \cos(\omega_{IF}(n/f_s - \tau_l^{still} - D)) +$$
$$B \cdot \cos(\omega_c D) \cdot \cos(\omega_{IF}(n/f_s - D))$$

where $R_k^{motion}(t) = \tilde{R}(n/f_s)$, $R_k^{motion}(t) = \tilde{\tau}(n/f_s)$, and $D = f_s \cdot D_a$.

The complex intermediate frequency I/Q carrier is mixed with the IF signal $r(n)$ by complex multiplication of the complex intermediate frequency sinusoidal signals p1 and p2 through the complex multiplication units C61 and C62, and the base band signal is reserved. A complex signal can be obtained as follows.

$$u(n) = 2 \cdot e^{jn\omega_{IF}/f_s} \cdot r(n) =$$
$$\sum_{k=0}^{K-1} \frac{A_k^{motion}}{R_k^{motion}(n)} \cdot \cos(\omega_c(\tau_k^{motion}(n) + D)) \cdot \exp(j\omega_{IF}(\tau_k^{motion}(n) + D)) +$$
$$\sum_{l=0}^{L-1} \frac{A_l^{still}}{R_l^{still}} \cdot \cos(\omega_c(\tau_l^{still} + D)) \cdot \exp(j\omega_{IF}(\tau_l^{still} + D)) +$$
$$B \cdot \cos(\omega_c D) \cdot \exp(j\omega_{IF} D) = \sum_{k=0}^{K-1} \frac{A_k^{motion}}{R_k^{motion}(n)} \cdot$$
$$\cos\left(\omega_c\left(\frac{2R_k^{motion}(n)}{c} + D\right)\right) \cdot e^{j\omega_{IF}(2R_k^{motion}(n)/c + D)} +$$
$$\underline{\sum_{l=0}^{L-1} \frac{A_l^{still}}{R_l^{still}} \cdot \cos\left(\omega_c\left(\frac{2R_l^{still}}{c} + D\right)\right) \cdot}_{}$$
$$\underline{e^{j\omega_{IF}(2R_l^{still}/c + D)} + B \cdot \cos(\omega_c D) \cdot e^{j\omega_{IF} D}}_{u_{DC}}$$

Observing N samples from the starting time $n_0$ can be expressed as $\{n_0 + \tilde{n} | 0 \leq \tilde{n} < N\}$. By observing in the time period and assuming the velocity of the moving object being a constant v, the variable distance of the $k_{th}$ moving object can be $R_k^{motion}(n_0) + v_k \cdot \tilde{n}/f_s$, where $R_k^{motion}(n_0)$ is the distance corresponding to time $n_0$. If the phase $\omega_{IF} v_k \tilde{n}/(cf_s)$ is small and negligible, the equation can be expressed as follows.

$$u(n_0 + \tilde{n}) \approx$$
$$\sum_{k=0}^{K-1} G_k \cdot \cos\left(\omega_{D,k} \tilde{n} + \omega_c\left(\frac{2R_k^{motion}(n_0)}{c} + D\right)\right) \cdot e^{j\omega_{IF}(2R_k^{motion}(n_0)/c + D)} + u_{DC}$$

The Doppler frequency can be expressed as $$\omega_{D,k} = \frac{2\omega_c v_k}{f_s \cdot c}.$$

The amplitude is $G_k$, which is directly proportional to $$\frac{A_k^{motion}}{R_k^{motion}}$$

and the radar cross section.

The result of the discrete time Fourier transform of $\{u(n_0 + \tilde{n}) | 0 \leq \tilde{n} < N\}$ is $$U(\omega) = \sum_{k=0}^{K-1} G_k \cdot e^{j\omega_{IF}(2R_k^{motion}(t_0)/c + D)} \cdot$$
$$\frac{e^{-j\phi_k \omega} \cdot \Psi_k(\omega + \omega_{D,k}) + e^{j\phi_k \omega} \cdot \Psi_k(\omega - \omega_{D,k})}{2} +$$
$$u_{DC} \cdot e^{-j\omega(N-1)/2} \cdot \frac{\sin(\omega N/2)}{\sin(\omega/2)}$$

-continued where $\phi_k = \frac{\omega_c}{\omega_{D,k}}\left(\frac{2R_k^{motion}(n_0)}{c} + D\right)$.

The response $\Psi_k(\omega)$ can be expressed as $$\Psi_k(\omega) = \mathcal{F}\left\{\frac{A_k^{motion}}{R_k^{motion}(n_0 + \tilde{n})} \cdot rect_T(\tilde{n})\right\}$$

Considering $\omega=0$, $\Psi_k(\omega)$ can have narrow frequency range and is a Hermitian function. The peak can fall at $\omega=0$, and $\omega_k(0)$ can be a real number. $\omega_k(\omega)=\omega_k^*(-\omega)$.

Figure 7:
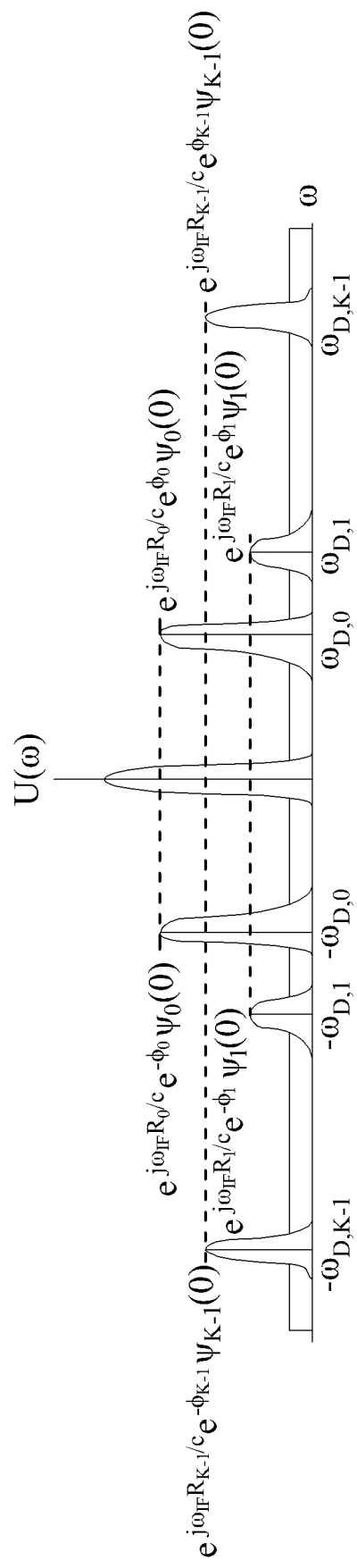
FIG. 7 is the diagram of the positive frequency peak signal and the negative frequency peak signal.

In FIG. 7, the spectral peaks can be on the positive and negative region of the Doppler frequency $\{\pm\omega_{D,k}|0\leq k<K\}$.

FIG. 7 is the diagram of the positive frequency peak signal $U(+\omega_{D,k})$ and the negative frequency peak signal $U(-\omega_{D,k})$ generated by the first signal $u_1(n)$ (I signal $u_I(n)$) and the second signal $u_2(n)$ (Q signal $u_Q(n)$) in FIG. 6 through the time domain to frequency domain conversion. The spectrum is Hermitian symmetric at positive and negative frequencies. The peak region can be selected according to k (the $k_{th}$ measured object). The area near the vertical axis portion corresponds to direct current (DC) portion of the signal. $R_k$ represents the distance between the $k_{th}$ object and the moving object detection circuit 600.

Figure 8:
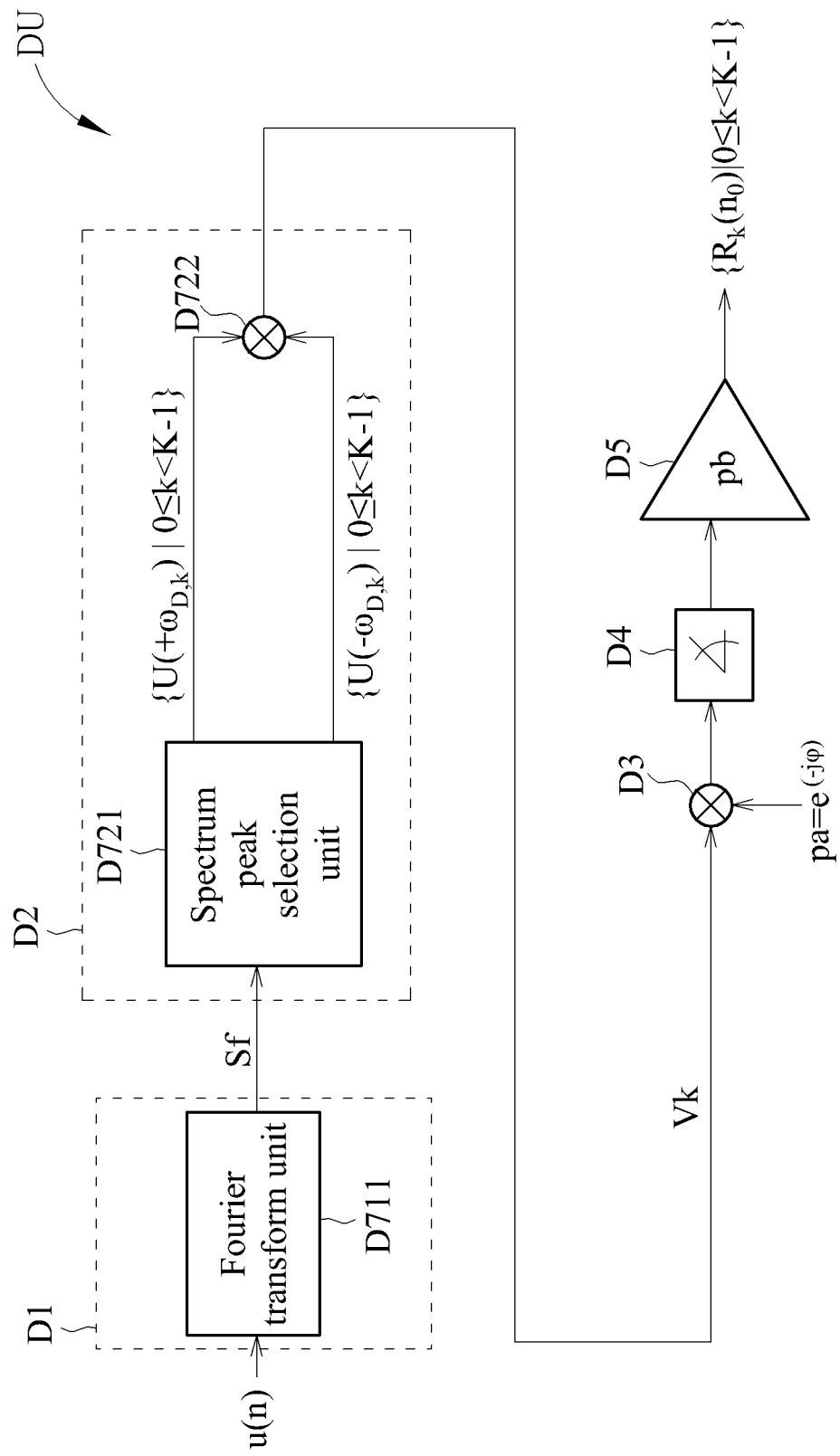
FIG. 8 is a diagram of the distance detecting unit in the embodiment of FIG. 6.

FIG. 8 is a diagram of the distance detecting unit DU in the embodiment of FIG. 6. As shown in FIG. 8, the time domain to frequency domain analysis unit D1 of the distance detecting unit DU may include a Fourier transform unit D711 for performing Fourier transform on the time domain signal u(n) to generate a frequency domain signal Sf. The time domain signal u(n) can be generated according to the first signal $u_1(n)$ and the second signal $u_2(n)$. It can be expressed as $u(n)=u_I(n)+j\cdot u_Q(n)$. The Fourier transform unit D711 can perform short time interval Fourier transform (STFT). The spectral peak analysis unit D2 may include a spectral peak selection unit D721 and a multiplication unit D722. The spectral peak selection unit D721 can select a peak region corresponding to the measured object obj according to whether the intensity frequency domain signal Sf has reached a threshold value, and output a positive frequency peak signal $\{U(+\omega_{D,k})|0\leq k<K-1\}$ and the negative frequency peak signal $\{U(-\omega_{D,k})|0\leq k<K-1\}$. The positive frequency peak signal corresponds to the positive Doppler spectral peaks region, and the negative frequency peak signal corresponds to the negative Doppler spectral peaks region. The multiplication unit D722 can multiply the positive frequency peak signal $U(+\omega_{D,k})$ with the negative frequency peak signal $U(-\omega_{D,k})$ to generate the calculated value Vk. The operating principle of the multiplication unit D3, the phase extraction unit D4, and the amplification unit D5 in FIG. 8 can be similar to that in FIG. 4. According to the embodiment, the spectral peak selection unit D721 may be disposed after the multiplication unit D722. It means that the multiplication is performed first, and then the spectral peak selection is performed.

In FIG. 8, the distance range of the estimated moving object can be calculated as follows. From U ($\omega$) of the spectrum, the spectral peak with intensity in frequency domain reaching the threshold value can be selected to detect the movement of the measured object. The spectral peak generated by the movement of the measured object can occur at both negative and positive Doppler frequencies, which can be symmetric to the position where f=0. After confirming the spectral peak value and the Doppler frequency, the distance range of the antenna devices ANTx and ANTr to the moving object is calculated as follows.

$$R_k^{motion}(t_0) = c\left(\frac{\angle\{U(+\omega_{D,k})\cdot U(-\omega_{D,k})\cdot e^{-j\varphi}\}}{8\pi f_{IF}}\right), 0 \leq k < K$$

$$\varphi = 4\pi f_{ID}D.$$

The calibration of $e^{j\varphi}$ is as follows.

By placing a large scatter at a distance called zero-range, the DC term of u(n) can be expressed as $$u_{DC,calibrate} = \left(G\cdot\cos\left(\omega_c\left(\frac{2R_\epsilon}{c} + D\right)\right)\cdot e^{j2\omega_{IF}R_\epsilon/c} + B\cdot\cos(\omega_c D)\right)\cdot e^{j\omega_{IF}D}$$

G is related the large scatter and direction proportional to the parameter of the radar cross section.

The small measurement error $R_\epsilon$ can be a few centimeters, so $e^{j2\omega_{IF}R_\epsilon/c}$ can be roughly equal to 1.

$$\frac{u_{DC,calibrate}}{|u_{DC,calibrate}|} \approx e^{j\omega_{IF}D}.$$

The DC term can be obtained from performing the Fourier transform on U($\omega$=0).

$$e^{j\omega_{IF}D} \approx \frac{U(0)}{|U(0)|}.$$

Figure 9:
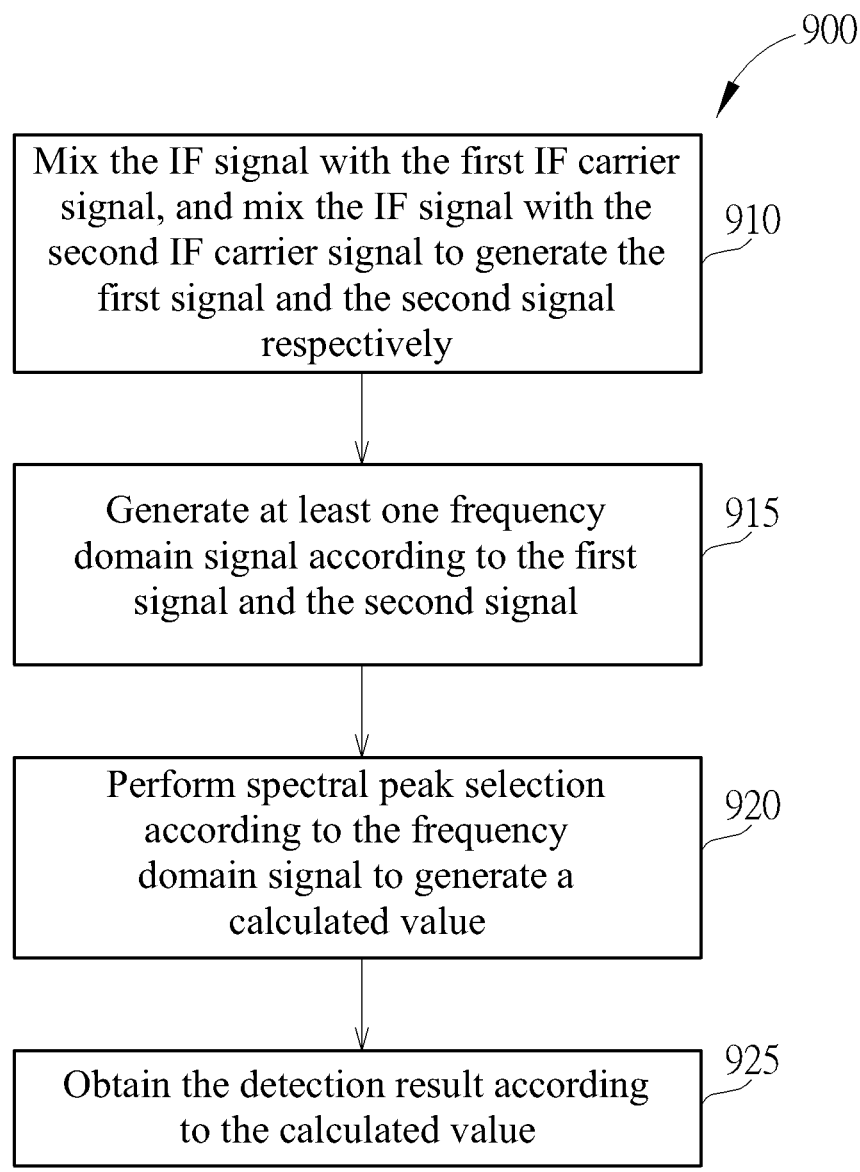
FIG. 9 is a flow chart of a method for detecting movement information of a measured object in the embodiment.

FIG. 9 is a flow chart of a method 900 for detecting movement information of a measured object obj in the embodiment. As shown in FIGS. 1, 2, and 9, the method 900 can include the following steps:

S910: Mix the IF signal r(n) with the first IF carrier signal p1, and mix the IF signal r(n) with the second IF carrier signal p2 to generate the first signal $u_1(n)$ and the second signal $U_2(n)$ respectively;

S915: Generate at least one frequency domain signal Sf according to the first signal $u_1(n)$ and the second signal $u_2(n)$;

S920: Perform spectral peak selection according to the frequency domain signal Sf to generate a calculated value Vk; and S925: Obtain the detection result $R_k$ according to the calculated value Vk.

The IF signal r(n) may be related to the at least one digital signal Sd. The digital signal Sd is generated according to the signal reflected by the object obj, and the detection result $R_k$ corresponds to the distance of the object obj. The first signal $u_1(n)$ and the second signal $u_2(n)$ in the embodiment in FIG. 3 may be a positive frequency signal $u_p(n)$ and a negative frequency signal $u_n(n)$, respectively. The embodiments may be the I signal $u_I(n)$ and the Q signal $u_Q(n)$ respectively. The details have been described in the previous paragraphs.

Figure 10:
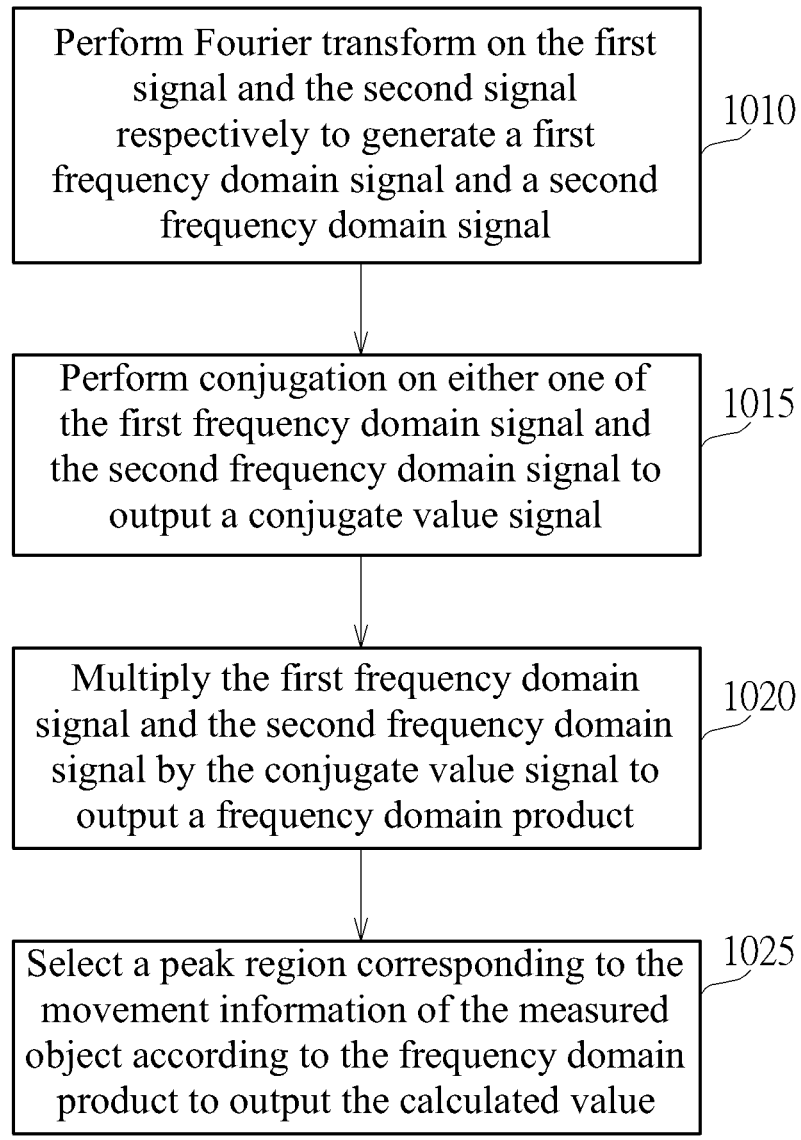
FIG. 10 is a flow chart of steps S915 to S920 in FIG. 9.

FIG. 10 is a flow chart of steps S915 to S920 in the embodiment. For example, in the embodiments of FIGS. 3 and 4, steps 915 to 920 may include:

S1010: Perform Fourier transform on the first signal (signal $u_p(n)$) and the second signal (signal $u_n(n)$) respectively to generate a first frequency domain signal $U_p(\omega)$ and a second frequency domain signal $U_n(\omega)$;

S1015: Perform conjugation on either one of the first frequency domain signal $U_p(\omega)$ and the second frequency domain signal $U_n(\omega)$ to output a conjugate value signal.

S1020: Multiply the first frequency domain signal $U_p(\omega)$ and the second frequency domain signal $U_n(\omega)$ by the conjugate value signal to output a frequency domain product; and S1025: Select a peak region corresponding to the movement information of the measured object obj according to the frequency domain product to output the calculated value Vk.

Step S915 can include step S1010 and step S920 can include steps S1015 through S1025. Taking FIG. 5 as an example, step S1010 can be performed with the time domain to frequency domain analysis unit D1. Step S1015 can be performed with the conjugation unit D23. The conjugate value signal can be $U_n^*(\omega)$. Step S1020 can be performed with the multiplication unit D22. Step S1025 can be performed with the spectral peak selection unit D21.

Figure 11:
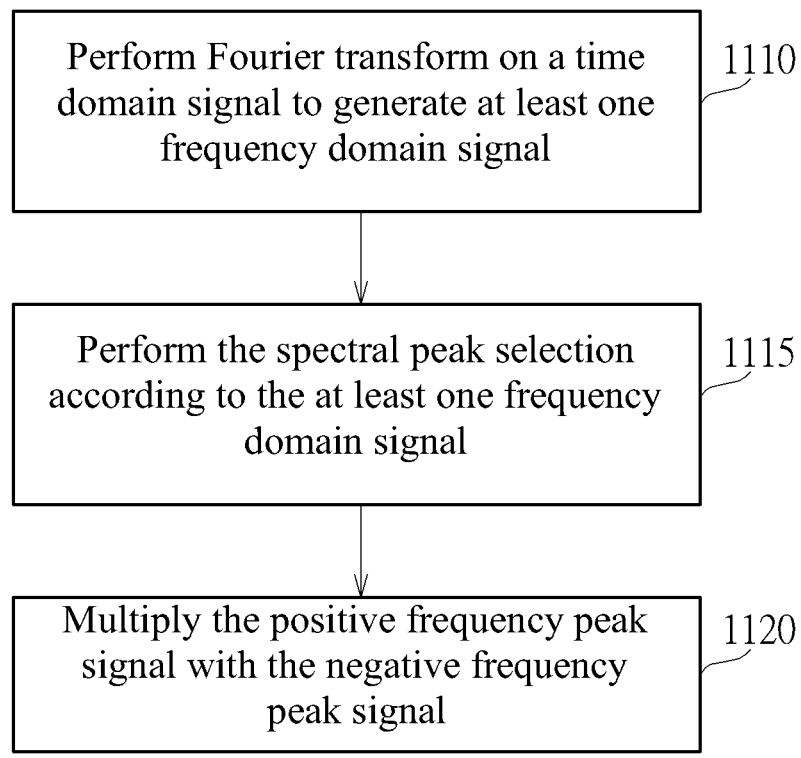
FIG. 11 is a flow chart of steps S915 to S920 in FIG. 9.

FIG. 11 is a flow chart of steps S915 to S920 in the embodiment. For example, in the embodiments of FIGS. 6 and 8, steps S915 to S920 may include:

S1110: Perform Fourier transform on the time domain signal u(n) to generate a frequency domain signal Sf, wherein the time domain signal u(n) is generated according to the first signal $u_1(n)$ and the second signal $u_2(n)$;

S1115: Select a peak region corresponding to the measured object obj according to the frequency domain signal Sf, and output a positive frequency peak signal $U(+\omega_{D,k})$ and a negative frequency peak signal $U(-\omega_{D,k})$;

S1120: Multiply the positive frequency peak signal $U(+\omega_{D,k})$ with the negative frequency peak signal $U(-\omega_{D,k})$ to generate a calculated value Vk.

Step S915 can include step 1110, and step S920 can include steps S1115 to S1120. Taking FIG. 8 as an example, step S1110 can be performed with the Fourier transform unit D711. Step S1115 can be performed with the spectral peak selection unit D721. Step S1120 can be performed with the multiplication unit D722.

According to the embodiment, the reference signal generating unit E in FIGS. 3 and 6 may include an analog oscillator. In this case, an analog-to-digital converter (ADC) may be disposed between the reference signal generating unit E and the mixing unit C. And, the digital-to-analog conversion circuit F in the FIGS. 3 and 6 can be removed. The intermediate frequency $f_{IF}$ may be hundreds to millions of Hz, and the movement of the object may be a movement of a small distance, such as breathing and heartbeat.

Using the object movement detection circuit and method provided in the embodiment, a double sideband intermediate frequency radar can be used to detect the movement information of the object. By selecting the peak region in the spectrum, it can extract the spatial information of the object only from the signal corresponding to the movement portion. Therefore the influence of the signal corresponding to the static portion and the leakage current of the circuit board can be reduced. The embodiment can avoid the conventional method of direct conversion of I/Q signals, so as to provide an improved solution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A moving object detection circuit for detecting movement information of a measured object, the moving object detection circuit comprising:
    a first mixing circuit configured to mix a RF carrier signal and a first analog signal to generate a second analog signal, wherein the first analog signal is generated by a transmitted signal reflecting from the measured object;
    an analog-to-digital conversion circuit coupled to the first mixing circuit and configured to generate at least one first digital signal according to the second analog signal;
    a first mixing unit configured to mix an IF signal and a first IF carrier signal to generate a first signal, and mix the IF signal and a second IF carrier signal to generate a second signal, wherein the first IF carrier signal and the second IF carrier signal are related to an intermediate frequency, and the IF signal is related to the at least one first digital signal; and
    a distance detecting unit configured to generate a detection result according to the first signal and the second signal, wherein the detection result corresponds to a distance between the measured object and the moving object detection circuit;
    wherein the distance detecting unit comprises:
        a time domain to frequency domain analysis unit configured to generate at least one frequency domain signal according to the first signal and the second signal; and
        a spectral peak analysis unit configured to perform spectral peak selection according to the at least one frequency domain signal to generate a calculated value, wherein the calculated value is related to the detection result.

2. The moving object detection circuit of claim 1, wherein the first mixing unit comprises:
    a first complex multiplication unit configured to perform a complex multiplication operation on the first IF carrier signal and the IF signal to generate the first signal; and
    a second complex multiplication unit configured to perform a complex multiplication operation on the second IF carrier signal and the IF signal to generate the second signal;
    wherein the IF signal comprises the first digital signal and a second digital signal.

3. The moving object detection circuit of claim 2, wherein the time domain to frequency domain analysis unit comprises:
    a first Fourier transform unit configured to perform Fourier transform on the first signal to generate a first frequency domain signal; and
    a second Fourier transform unit configured to perform Fourier transform on the second signal to generate a second frequency domain signal.

4. The moving object detection circuit of claim 3, wherein the spectral peak analysis unit comprises:
    a conjugation unit configured to perform a conjugate operation on either one of the first frequency domain signal and the second frequency domain signal to output a conjugate value signal;
    a multiplication unit configured to multiply another one of the first frequency domain signal and the second frequency domain signal with the conjugate value signal to output a frequency domain product; and
    a spectral peak selection unit configured to select a peak region corresponding to movement information of the measured object according to the frequency domain product to output the calculated value.

5. The moving object detection circuit of claim 2, further comprising:
a reference signal generating unit configured to generate the first IF carrier signal and the second IF carrier signal related to the intermediate frequency.

6. The moving object detection circuit of claim 5, further comprising:
a digital-to-analog conversion circuit configured to receive a third IF carrier signal and generate a third analog signal accordingly;
a second mixing circuit configured to receive the third analog signal and the RF carrier signal and generate a fourth analog signal accordingly; and
a reference signal generating circuit configured to generate the RF carrier signal.

7. The moving object detection circuit of claim 6, wherein the reference signal generating unit is further configured to generate the third IF carrier signal related to the intermediate frequency.

8. The moving object detection circuit of claim 6, wherein the transmitted signal is generated by the fourth analog signal.

9. The moving object detection circuit of claim 2, wherein:
the first mixing circuit comprises:
a first mixer configured to mix the RF carrier signal and the first analog signal to generate an I analog signal; and
a second mixer configured to mix a phase shift signal and the first analog signal to generate a Q analog signal;
wherein the second analog signal comprises the I analog signal and the Q analog signal, and the phase shift signal is generated by shifting the RF carrier signal by a phase shift value;
the analog-to-digital conversion circuit comprises:
a first analog-to-digital converter configured to receive the I analog signal to generate an I digital signal; and
a second analog-to-digital converter configured to receive the Q analog signal to generate a Q digital signal;
wherein the first digital signal comprises the I digital signal and the second digital signal comprises the Q digital signal.

10. The moving object detection circuit of claim 1, wherein the distance detecting unit comprises:
a multiplication unit configured to multiply the calculated value and a first adjustment parameter to generate a product of the calculated value and the first adjustment parameter;
a phase extracting unit configured to extract a phase value of the product of the calculated value and the first adjustment parameter; and
an amplification unit configured to multiply the phase value by a second adjusting parameter to generate the detection result.

11. The moving object detection circuit of claim 1, wherein the first mixing unit comprises:
a first multiplication unit configured to perform a multiplication operation on the first IF carrier signal and the IF signal to generate the first signal; and
a second multiplication unit configured to perform a multiplication operation on the second IF carrier signal and the IF signal to generate the second signal.

12. The moving object detection circuit of claim 11, wherein:

the time domain to frequency domain analysis unit comprises:
a Fourier transform unit configured to perform Fourier transform on a time domain signal to generate the at least one frequency domain signal, wherein the time domain signal is related to the first signal and the second signal.

13. The moving object detection circuit of claim 12, wherein the spectral peak analysis unit comprises:
a spectral peak selection unit configured to select a peak region corresponding to the measured object according to the at the least one frequency domain signal to output a positive frequency peak signal and a negative frequency peak signal; and
a multiplication unit configured to multiply the positive frequency peak signal and the negative frequency peak signal to generate the calculated value.

14. The moving object detection circuit of claim 11, further comprising a reference signal generating unit configured to generate the first IF carrier signal and the second IF carrier signal related to the intermediate frequency.

15. The moving object detection circuit of claim 14, further comprising:
a digital-to-analog conversion circuit configured to receive a third IF carrier signal and generate a third analog signal accordingly;
a second mixing circuit configured to receive the third analog signal and the RF carrier signal and generate a fourth analog signal accordingly; and
a reference signal generating circuit configured to generate the RF carrier signal.

16. The moving object detection circuit of claim 15, wherein the reference signal generating unit is further configured to generate the third IF carrier signal related to the intermediate frequency.

17. The moving object detection circuit of claim 11, wherein
the first mixing circuit comprises:
a first mixer configured to mix the RF carrier signal and the first analog signal to generate the second analog signal; and
the analog-to-digital conversion circuit comprises:
a first analog-to-digital converter configured to generate the at least one first digital signal according to the second analog signal.

18. A method for detecting movement information of a measured object, comprising:
mixing an IF signal and a first IF carrier signal to generate a first signal, and mixing the IF signal and a second IF carrier signal to generate a second signal;
generating at least one frequency domain signal according to the first signal and the second signal;
performing spectral peak selection according to the at least one frequency domain signal to generate a calculated value; and
obtaining a detection result according to the calculated value;
wherein the IF signal is related to at least one first digital signal, the at least one first digital signal is generated according to a signal reflected by the measured object, and the detection result corresponds to a distance of the measured object.

19. The method of claim 18, wherein:
generating the at least one frequency domain signal according to the first signal and the second signal, comprises:

performing Fourier transform on the first signal and the second signal to generate a first frequency domain signal and a second frequency domain signal respectively;
wherein the at least one frequency domain signal comprises the first frequency domain signal and the second frequency domain signal; and
performing the spectral peak selection according to the at least one frequency domain signal to generate the calculated value, comprises:
performing conjugation on either one of the first frequency domain signal and the second frequency domain signal to output a conjugate value signal; and
multiplying another one of the first frequency domain signal and the second frequency domain signal by the conjugate value signal to output a frequency domain product; and
selecting a peak region corresponding to the movement information of the measured object according to the frequency domain product to output the calculated value.

20. The method of claim 18, wherein:
generating the at least one frequency domain signal according to the first signal and the second signal, comprises:
performing Fourier transform on a time domain signal to generate at least one frequency domain signal, wherein the time domain signal is generated according to the first signal and the second signal; and
performing the spectral peak selection according to the at least one frequency domain signal to generate the calculated value, comprises:
selecting a peak region corresponding to the measured object according to the at least one frequency domain signal, and generating a positive frequency peak signal and a negative frequency peak signal accordingly; and
multiplying the positive frequency peak signal with the negative frequency peak signal to generate the calculated value.

* * * * *